United States Patent [19]

Fielden

[11] 4,331,915
[45] May 25, 1982

[54] DETECTION OF TAMPERING OF KILOWATT-HOUR METERS FOR MEASURING ELECTRICAL ENERGY CONSUMPTION

[75] Inventor: John S. Fielden, Ottery St. Mary, England

[73] Assignee: South Eastern Electricity Board, England

[21] Appl. No.: 110,026

[22] Filed: Jan. 7, 1980

[30] Foreign Application Priority Data

Jan. 11, 1979 [GB] United Kingdom ................. 7901132

[51] Int. Cl.³ .......................... G01R 11/24; G01R 1/20
[52] U.S. Cl. ..................................... 324/110; 324/127
[58] Field of Search ............... 324/110, 127, 157, 133, 324/102

[56] References Cited

U.S. PATENT DOCUMENTS 3,848,178  11/1974  Marks ................................. 324/110

FOREIGN PATENT DOCUMENTS 839972  7/1949  Fed. Rep. of Germany .
691299  5/1953  United Kingdom .

Primary Examiner—Ernest F. Karlsen
Attorney, Agent, or Firm—Beveridge, De Grandi & Kline

[57] ABSTRACT

To detect tampering of a kilowatt-hour meter by the connection of a bypass link across the live connection through the meter, a voltage transformer within the meter unit is coupled to this live connecton so that a small volage is induced in the live connection in opposition to the supply voltage. The induced voltage produces a circulating current in the loop formed by the live connection and the bypass link and the transformer coupling is such that, with a bypass link of negligible resistance, the total current in the live connection is in opposite phase to the applied voltage. By means of a current transformer, a logic unit and a microprocessor, the phase of the current in the live connection within the meter is determined and is indicated by a latched flag indicator and/or transmitted to a distant data processor by a data link. Using a second current transformer in the return supply lead, the supply and return currents in the leads within the meter unit can be compared in the logic unit and processor to determine if the live connection is broken within the bypassed length. By means of contacts on the housing, indication is given if the housing of the unit has been opened.

12 Claims, 1 Drawing Figure

U.S. Patent
May 25, 1982
4,331,915
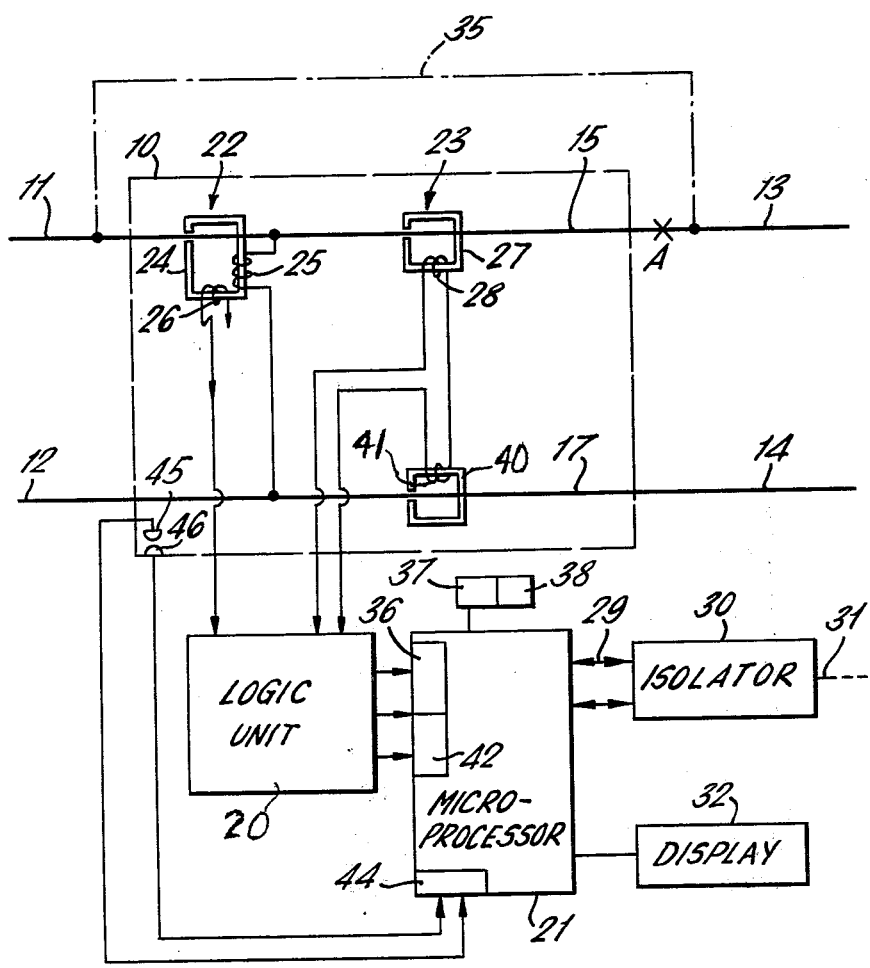

DETECTION OF TAMPERING OF KILOWATT-HOUR METERS FOR MEASURING ELECTRICAL ENERGY CONSUMPTION

BACKGROUND OF THE INVENTION

This invention relates to kilowatt-hour meters such as are provided by an electrical supply utility on a consumer's premises to measure electrical energy consumption.

The present invention is concerned more particularly with the detection of any tampering with the metering. It is the usual practice to seal the meter unit, e.g. with lead seals, so that it can readily be determined by visual inspection whether anyone has opened the meter unit. One common method of tampering with the meter is to put a wire link as a bypass across the unit. This link is put between the live lead on the utility side of the meter and a point on the live lead on the consumer side of the meter, commonly at the consumer's switch and fuse unit. The link bypasses the meter so that only about half the energy consumed is recorded by the meter; the other half passes through the bypass link. It is possible to take the further step of breaking the lead between the meter and the connection to the "illegal" link so that no current passes through the meter and thus no energy consumption is recorded. This further step is less common because such a break in the lead leaves visible evidence of tampering.

SUMMARY OF THE INVENTION

It is a primary object of the present invention to provide means for detecting the provision of an energy bypass across the meter.

It is convenient to refer to the live lead; this term is used in the present specification to mean the lead carrying the current which is utilised for energy consumption measurement in the meter. In practice, in a single phase two-wire supply system, one of the leads is the neutral of the supply system and the current is always measured on the other lead which is the "live" lead. In considering the problem of tampering with the meter, any bypass link must be put across the current responsive path in the meter.

According to this invention in a kilowatt-hour meter for measuring consumption of electrical energy from an alternating supply, the live lead is magnetically coupled to a voltage transformer energised from the incoming supply, in such a sense as to induce in the live lead a small voltage in phase opposition to the input from the supply on that lead, and means are provided for indicating or signalling or recording if a current flows in the live lead in phase opposition to the supply voltage on that lead.

The aforesaid small voltage is a voltage which is small compared with the supply voltage. Typically the live lead, in the meter, passes through a closed loop core, which has a multi-turn input voltage winding, e.g. with 1200 turns. The voltage induced in the live lead is thus 0.2 volts for a 240 volt supply. If no bypass link is put on the meter, this small induced voltage has negligible effect. If however the meter is bypassed with a link of negligible resistance, this induced voltage will cause a circulating current through the loop circuit formed by the bypass link and the live lead path through the meter. The phase of the voltage is such that the total current in the live lead within the meter is in the opposite phase to the applied voltage, i.e. in the opposite direction to that in which the current would flow if no bypass link were in place.

The means for indicating or signalling or recording if the current flows in the live lead in phase opposition to the supply voltage on that lead conveniently comprises a phase comparator together with latching means holding an output signal indicating phase opposition.

Conveniently a flag indicator, preferably a mechanical indicator, is provided responsive to the output of the phase comparator for indicating the presence of a current in phase opposition to the supply voltage. The flag indicator may have mechanical latching means so that the flag signal remains operative even if the power supply is interrupted. The flag signal may be made resettable only after opening the meter.

Such a flag signal may be provided on any type of kilowatt hour meter, e.g. an electromechanical meter of conventional type; the display of the flag signal would be noted when the meter is read or, in the case of a prepayment meter, when the coin box is emptied. As will be apparent however the invention is particularly applicable to electronic meters in which the current and voltage values are processed electronically.

If the meter has a data signalling link to a central data processor, it is not essential to display the flag signal visually. The output of the phase comparator or presence of the flag signal may be recorded at the central data processor by transmission of information over the data link. It is usually envisaged that meters with such a data signalling link should be periodically interrogated by the central data processor, and provided the flag signal has latching means to maintain the indication or the phase comparator output is latched, the required information will be recorded when the meter is interrogated.

The phase comparison can be made using a solid state phase comparator in the meter, the phase comparator being energised from the incoming mains supply, conveniently using a further winding on the voltage transformer.

Conveniently the phase comparison is effected by pulse sampling using a short duration sampling pulse interrogating the current polarity at a time 90° or 270° after a voltage zero of the voltage from the incoming supply. The current may be sampled using a current transformer coupled to the live lead in the meter.

If, in tampering with the meter, the live lead connection to the meter is broken, either on the input side or the output side of the meter, then there will be no closed circuit loop made by the bypass link and the live lead through the meter and hence the voltage transformer will not cause any current flow through the live lead in the meter. To detect the presence of such a break in the live lead, means may be provided operative to compare the currents in the live lead and the return lead (i.e. the neutral in the case of a single phase supply) within the meter and to indicate or signal or record if the current in the return lead exceeds that in the live lead by a predetermined amount.

Considering the common case where the return lead is the supply neutral, if the meter is operating correctly, without any bypass link, the currents in the live lead and neutral are substantially equal, the only difference being due to possible earth currents. The current comparison means are set to operate only when the current in the neutral exceeds that in the live lead by an amount greater than any possible earth leakage current. The current comparator may be arranged to operate the same flag signal as is used to indicate the direction of flow of current in the live lead and/or may be arranged to provide information for transmission over a data signalling link to a central data processor. In the absence of any tampering with the meter, the current comparison in effect measures the earth leakage and can be utilised as an earth current leakage detector. It can be arranged to indicate excessive current or to trip a circuit breaker if the earth leakage exceeds some predetermined value.

For comparing the two currents, current transformers may be provided in the live and neutral links. That in the live lead may be the same current transformer as is used for determining the direction of current flow. Pulse sampling means may be provided for sampling the magnitudes of the two currents, preferably at 90° or 270° after a voltage zero. The sampled magnitudes may then be fed to a solid state comparator circuit.

The invention furthermore includes within its scope a kilowatt-hour meter for measuring consumption of electrical energy from a single phase alternating supply having two supply leads and responsive to the current in one supply lead and the voltage between the two leads, wherein means are provided for comparing the magnitudes of the currents in the two leads and indicating or signalling or recording if the difference exceeds a predetermined amount.

Preferably a checking circuit is provided through contact elements which are in contact when the meter housing is closed but which are moved apart to break the circuit if the meter is opened and means are provided responsive to interruption of said checking circuit for indicating or signalling or recording if the housing is opened. These means may be arranged to operate the same flag signal as is used to indicate the direction of flow of current in the live lead and/or may be arranged to provide information for transmission over a data signalling link to a control data processor.

BRIEF DESCRIPTION OF THE DRAWING

The accompanying drawing is a block diagram illustrating one construction of kilowatt-hour meter embodying the invention.

DESCRIPTION OF THE PREFERRED EMBODIMENT

Referring to the drawing, the kilowatt-hour meter comprises a unit 10. The incoming alternating mains supply from the utility is a single phase supply on live lead 11 and neutral 12. From the meter there are two leads 13,14 to the consumer's switch and fuse unit (not shown). In the unit 10, there is a live connection 15 between lead 11,13 and a neutral connection 17 between leads 12,14.

The particular meter in the embodiment is a solid state electronic meter having a logic unit 20 and data processor 21, typically a microprocessor. The logic unit 20 receives a voltage input from a voltage transformer 22 and a current input from a current transformer 23. In this particular embodiment, the voltage transformer 22 has a closed loop core 24 with an input winding 25 connected, within the unit 10, between the live lead connection 15 and neutral connection 17. An output winding 26 provides a power supply and a voltage reference for the logic unit 20 and data processor 21. The current transformer comprises a closed loop core 27 around the live connection 15 and an output winding 28. The data processor 21, which physically may be separated from the logic unit, processes the voltage and current data and provides output data, including energy consumption data, on data output lines 29. These may be connected via an isolating unit 30 to a data transmission link 31 such that the processor 21 can be interrogated by and will feed information to a central data processor at the utility. The microprocessor also feeds a display unit 32 on the consumer's premises; typically this is an electronically operated digital display.

The present invention is concerned more particularly with the detection of any tampering with the meter and it is not necessary to discuss further how the logic unit 20 and processor 21 provide energy consumption data.

The commonest way of tampering with the kilowatt-hour meter is to put a bypass link, shown by a chain line 35, between the lead 11 and the lead 13. This is in parallel with connection 15 and therefore about half the current taken by the consumer would pass through the link 35 and thus only part of the energy consumed is recorded by the meter. As a further step, the lead 13 may be broken at A between the meter unit 10 and the junction with the bypass link 35 so that all the power consumed passes through the link 35. To detect the presence of a bypass link, the connection 15 is taken through the core 24 of the voltage transformer 22. In a typical construction for a 240 V. mains supply, the input winding 25 has 1200 turns and the output winding 26 has 60 turns to give a 12 V. supply to the logic unit and processor. The single turn coupling to the connection 15 induces 0.2 V. in that connection and the coupling is made in a sense such that this opposes the input voltage on lead 11. If a bypass link 35 is put across the unit 10 without any break at A, this voltage causes a circulating current to flow in the closed loop circuit formed by connection 15 and link 35, the current being in opposite phase to the applied voltage.

Phase comparison means, indicated diagrammatically at 36 are provided to compare the phase of the current from the current transformer output winding 28 with the reference voltage from winding 26. Since a data processor 21 is available, conveniently the phase comparison is effected by pulse sampling the current from the current transformer winding 28 at 90° or 270° in phase after the voltage from the voltage winding 26 and then comparing the polarities of the two sampled signals. By pulse sampling with short duration pulses in this way, a comparison in the processor as to whether the sampled signals are of like or opposite polarities determines the direction of current flow in connection 15 irrespective of a phase lag or lead of the current, with respect to the voltage, drawn by the consumer from the supply. Means, indicated diagrammatically at 37, are provided responsive to a detected current flow in lead 15 showing the presence of a link 35, to provide a latched output, i.e. an output which will be retained until reset, which latched output may be fed to a flag indicator 38 and/or to the data output lines 29.

It will be appreciated that, since a microprocessor is available, phase comparison can most conveniently be effected using pulse sampling to provide input signals to the microprocessor which is programmed to give the required output data. If no microprocessor was available, e.g. in an electro-mechanical kilowatt-hour meter, the voltage and current transformers may be provided as described above to give inputs to any convenient type, analogue or digital, of phase comparator, the output of which may operate a flag indicator.

To retain the indication of the use of a bypass link, even after the link is removed, the output indication may be latched. Latching means may be provided for latching the signal feed to the flag indicator but preferably the flag indicator is mechanically latched to preserve the indication even in the event of an interruption of the power supply.

The flag indicator 38 conveniently comprises indicating means, e.g. a mechanically movable flag, behind a window in the unit 10 and reset means which can only be operated by opening the housing of unit 10, which housing is normally sealed. If a data transmission link to a central data processor is available, it may in some cases be preferred not to give any visible indication at the meter unit 10. Using a data transmission link, checks may be made automatically and frequently for the presence of a bypass link across the meter. In this case it is not necessary to latch the output of the phase comparator. If latching is provided, it may be effected mechanically or electrically in the logic unit 20 or by programming of processor 21. If such latching is provided, reset means would be provided at the unit 10 for cancelling the signal after the meter unit has been checked for tampering.

If the live lead 13 is broken at A, then there is no closed loop through connection 15 and bypass link 35. To detect this condition, a current transformer 40 is provided on the neutral connection 17 and the output from output winding 41 of this current transformer is fed to the logic unit 20 for comparison of its magnitude with the output from current transformer 23 on the live connection 15. Because of possible earth leakage faults, these two currents may not be exactly equal. The amplitude comparator, indicated diagrammatically at 42, is arranged to give an output if the currents in the live and neutral connections differ by more than a predetermined amount. This output may be arranged to operate the aforementioned flag indicator 38 and/or to provide a signal for the data transmission link 29, 30 and 31 to the central processor. As before, the indication is latched and reset means are provided which are operable only by opening the housing of unit 10. The output of the amplitude comparator, if there is no tampering with the meter, gives a measure of the earth leakage current and hence can be used to indicate the magnitude of this current and/or for switching or flagging on excessive earth leakage.

To detect if the housing of unit 10 is opened, a circuit is provided through contact elements 45,46, which circuit is completed only so long as the housing is closed. Means, indicated diagrammatically at 44, and including a latch, are provided for giving an output signal if the circuit through elements 45,46 has been broken. This output signal may be arranged to operate the aforementioned flag indicator 38 and/or to provide a signal for the data transmission link to the central data processor.

I claim:

1. A kilowatt-hour meter for measuring consumption of electrical energy from an alternating supply having a live lead and a neutral or other return lead, which meter comprises a housing containing electrical energy consumption measuring means, a voltage transformer adapted to be energised from said alternating supply, which transformer is coupled to the live lead within the housing in such a sense as to induce in the live lead a small voltage in phase opposition to the input from the supply on that lead and means for indicating if a current flows in the live lead in phase opposition to the supply voltage on that lead.

2. A meter as claimed in claim 1 wherein the means for indicating or signalling or recording if the current flows in the live lead in phase opposition to the supply voltage on that lead comprises a phase comparator providing an output signal indicating phase opposition together with latching means for holding said output signal.

3. A meter as claimed in claim 2 wherein a flag indicator is provided responsive to the output signal from the phase comparator.

4. A meter as claimed in claim 3 wherein the latching means comprise a mechanical latching means for the flag indicator.

5. A meter as claimed in claim 2 and having a data transmission link arranged for transmitting data to a distant point indicative of the presence of an output from the phase comparator.

6. A meter as claimed in claim 3 and having a data transmission link arranged for transmitting data to a distant point indicative of the status of the flag indicator.

7. A meter as claimed in claim 2 wherein the phase comparator comprises pulse sampling means for pulse interrogating the polarity of the current in the live lead at a time 90° or 270° in phase after a voltage zero of the voltage from the increasing supply.

8. A meter as claimed in claim 7 wherein said phase comparator is a solid state phase comparator energised from the incoming mains supply by a further winding on said voltage transformer.

9. A meter as claimed in claim 1 wherein said voltage transformer comprises a closed loop core around the live lead, a multi-turn input winding on the core connected across the incoming supply and an output winding on the core for energising said means for indicating or signalling or recording if a current flows in the live lead in phase opposition to the supply voltage on that lead.

10. A meter as claimed in claim 2 wherein said means for indicating or signalling or recording includes a current transformer on the live lead to provide a current input for said phase comparator.

11. A meter as claimed in claim 10 and having a second current transformer coupled to the return supply lines and means for comparing the magnitudes of the currents in the live lead and return supply lines by determining the difference in outputs from the current transformers and means arranged for indicating or signalling or recording if the difference exceeds a predetermined amount.

12. A meter as claimed in claim 1 and having an openable housing and a checking circuit including contact elements which are in contact when the housing is closed but which are moved apart to break the checking circuit if the meter is opened and wherein means are provided responsive to interruption of the checking circuit for indicating or signalling or recording if the housing is opened.

* * * * *